United States Patent
Nakada et al.

(10) Patent No.: US 9,153,771 B2
(45) Date of Patent: Oct. 6, 2015

(54) THIN FILM MAGNETIC ELEMENT HAVING A PAIR OF FIRST SOFT MAGNETIC LAYERS SANDWICHING A MAGNETORESISTIVE EFFECT FILM AND A COIL WINDINGLY FORMED ABOUT A SECOND SOFT MAGNETIC LAYER

(71) Applicant: TDK CORPORATION, Tokyo (JP)

(72) Inventors: Katsuyuki Nakada, Tokyo (JP); Takahiro Suwa, Tokyo (JP); Kuniyasu Ito, Tokyo (JP); Masato Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/282,428

(22) Filed: May 20, 2014

(65) Prior Publication Data
US 2014/0340183 A1 Nov. 20, 2014

(30) Foreign Application Priority Data
May 20, 2013 (JP) .................. 2013-106260

(51) Int. Cl.
*G11B 5/39* (2006.01)
*H01L 43/02* (2006.01)
*H01L 43/08* (2006.01)

(52) U.S. Cl.
CPC .............. *H01L 43/02* (2013.01); *G11B 5/3906* (2013.01); *G11B 5/3909* (2013.01);
(Continued)

(58) Field of Classification Search
CPC ...... G11B 5/39; G11B 5/3929; G11B 5/3932; G11B 5/33; G11B 5/332; G11B 5/3903; G11B 5/3906; G11B 5/3909; G11B 5/3916; G11B 5/3922; G11B 5/3925; G11B 5/3935; G11B 5/3941; G11B 5/398; G11B 2005/3996
USPC ......... 360/324, 324.1, 324.11, 324.12, 324.2, 360/321
See application file for complete search history.

(56) References Cited

U.S. PATENT DOCUMENTS 8,881,378 B2 *  11/2014  Zhou et al. .................. 29/603.14
8,922,953 B1 *  12/2014  Childress ...................... 360/319
(Continued)

FOREIGN PATENT DOCUMENTS

| JP | A-2004-354181 | 12/2004 |
| JP | A-2006-303097 | 11/2006 |
| JP | B1-4551972 | 9/2010 |

OTHER PUBLICATIONS

Tulapurkar et al., "Spin-torque diode effect in magnetic tunnel junctions," *Nature*, Nov. 17, 2005, pp. 339-342, vol. 438, No. 7066.
(Continued)

*Primary Examiner* — Jefferson Evans
(74) *Attorney, Agent, or Firm* — Oliff PLC

(57) ABSTRACT

A magnetoresistive effect element includes a pair of first soft magnetic layers that are arranged opposite to each other so as to sandwich a magnetoresistive effect film; a second soft magnetic layer; and a coil that is windingly formed about the second soft magnetic layer. When a rear end region cross-sectional area of the first soft magnetic layers is defined as S1r and a tip end region cross-sectional area of the second soft magnetic layer is defined as S2f, S2f>S1r is established, and when a tip end width of the first soft magnetic layers is defined as W1f and a rear end width of the first soft magnetic layers is defined as W1r, W1r>W1f is established.

4 Claims, 13 Drawing Sheets

(52) U.S. Cl.
CPC ........... *G11B 5/3922* (2013.01); *G11B 5/3932* (2013.01); *G11B 5/3941* (2013.01); *H01L 43/08* (2013.01); *G11B 2005/3996* (2013.01)

(56) References Cited

U.S. PATENT DOCUMENTS

| | | | |
|---|---|---|---|
| 2005/0195535 A1* | 9/2005 | Shi et al. | 360/324.12 |
| 2007/0217084 A1* | 9/2007 | Xue et al. | 360/324.12 |
| 2010/0182723 A1* | 7/2010 | Yanagisawa | 360/324.12 |
| 2010/0264959 A1 | 10/2010 | Maehara | |
| 2012/0014012 A1* | 1/2012 | Holmberg | 360/55 |

OTHER PUBLICATIONS

Suzuki et al., "Microwave Properties of Spin Injection Devices—Spontaneous Oscillation, Spin-Torque Diode Effect and Magnetic Noise," *Magune*, 2007, pp. 282-290, vol. 2, No. 6 (w/ partial translation).

* cited by examiner

THIN FILM MAGNETIC ELEMENT HAVING A PAIR OF FIRST SOFT MAGNETIC LAYERS SANDWICHING A MAGNETORESISTIVE EFFECT FILM AND A COIL WINDINGLY FORMED ABOUT A SECOND SOFT MAGNETIC LAYER

BACKGROUND

This invention relates to a thin film magnetic element that is applied to wireless signal transmission, a new functional element for communication, and the like.

In recent years, in contrast with the field of electronics, in which electron charges are applied, attention has been given to the field of spintronics, in which electron charge and a spin are simultaneously used (Non-Patent Reference 1). Due to rapid development of magnetoresistive effect elements, which are represented by a giant magnetoresistive (GMR) effect and a tunneling magnetoresistance (TMR) effect, spintronics significantly contributes to industry in the form of hard disk drives (HDD) and magnetoresistive random-access memories (MRAM).

In a magnetoresistive effect element, it is known that as a spin is transmitted and transported, it becomes energy (spin-transfer torque) that rotates a spin of another ferromagnet. If this spin-transfer torque is used, at a certain constant energy, spin oscillation and resonance phenomena occur. Industrial uses have been proposed, as devices such as high-frequency oscillators, detectors, mixers, and filters that use these phenomena (Patent Reference 1). It is known for a high frequency characteristic of a magnetoresistive effect element to be controlled by an applied magnetic field and a spin-transfer torque (Non-Patent Reference 2).

The following application can be considered for an element using a high frequency characteristic of a magnetoresistive element (hereafter referred to as a "thin film magnetic element"). For example, a low-loss variable matching circuit must be implemented that can be used at high frequency areas of 1 GHz or higher for multi-banding and active tuning that are being considered for increasing the functions of a portable terminal. However, if a varicap diode is used for the matching circuit, a Q value is caused to be deteriorated, and an operation voltage is caused to increase, at high frequency areas of 1 GHz or higher. In contrast, these inventors discovered that if a thin film magnetic element is used for the matching circuit, there is a possibility that it will surpass a varicap diode in view of the Q value and the operation voltage, and these inventors have been working on the development. As mentioned earlier, a high frequency characteristic of a thin film magnetic element can be controlled by an applied magnetic field, but when industrial uses are considered, an element structure is needed that includes a magnetic field application mechanism that can variably, and over a wide range, control an applied magnetic field.

As an example of an element structure including a magnetic field application mechanism that variably controls an applied magnetic field, a structure is proposed in which a composite magnetic field of (i) a coil magnetic field by current control and (ii) a bias magnetic field by a bias hard magnetic layer is applied to a magnetoresistive effect film (Patent Reference 2).

Furthermore, a structure is proposed in which, by detailed control of a shape of a pair of soft magnetic layers, which is formed so as to sandwich a magnetoresistive effect film, a magnetic field applied to a magnetoresistive effect film is strengthened (Patent Reference 3).

Patent References

[Patent Reference 1] Japanese Patent 4551972
[Patent Reference 2] Japanese Published Patent Application 2006-303097
[Patent Reference 3] Japanese Published Patent Application 2004-354181

Non-Patent References

[Non-Patent Reference 1] Nature, Vol. 438, No. 7066, pages 339-342, Nov. 17, 2005
[Non-Patent Reference 2] Magne, Vol. 2, No. 6, 2007, pages 282-290

SUMMARY

However, the following problems are found in conventional technologies.

In the structure of Patent Reference 2, a coil magnetic field by current control functions so as to correct a shift amount when a bias magnetic field by a bias hard magnetic layer is shifted due to environment temperature history or the like. Specifically, a structure is provided in which a magnetic flux generated from a coil is induced to the vicinity of a magnetoresistive effect film by a magnetizable circuit layer, and the magnetic field is applied to the magnetoresistive effect film from the magnetizable circuit layer. When a magnetizable circuit layer is arranged in the vicinity of the magnetoresistive effect film, the magnetizable circuit layer film thickness is limited by the pattern size of the magnetoresistive effect film. For example, a case is considered in which the pattern size of the magnetoresistive effect film is 100 nm×100 nm. If a magnetizable circuit layer is formed by, for example, a lift-off method, first, a pillar of photoresist needs to be raised on the patterned magnetoresistive effect film. In this case, the pattern size of the magnetoresistive effect film is 100 nm, so a width of the photoresist also becomes approximately 100 nm. In this case, a film thickness of the photoresist becomes approximately 200 nm at maximum in view of an aspect ratio. Then, a film of the magnetizable circuit layer is formed and the lift-off method is applied, but the magnetizable circuit layer film thickness that is stably lifted off is limited to approximately 30 nm at maximum. If the magnetizable circuit layer film thickness is controlled to approximately 30 nm, during a step in which the magnetic flux that has been generated from a coil is propagated within the magnetizable circuit layer, the magnetic flux is significantly attenuated, and the magnetic flux within the magnetizable circuit layer in the vicinity of the magnetoresistive effect film is reduced. As a result, the magnetic field that is applied to the magnetoresistive effect film from the magnetizable circuit layer becomes weak. This magnetic field is sufficient for the purpose of correcting the shift amount when a bias magnetic field is shifted due to environment temperature history or the like; thus, a constant magnetic field can be applied to the magnetoresistive effect film. Therefore, the structure of Patent Reference 2 is a structure that is suitable for controlling the magnetoresistive effect film at a constant frequency, but has a problem in that a coil input current needs to be made large in order to control the magnetoresistive effect film in a wide frequency band.

In the structure of Patent Reference 3, by detailed control of the shape of the pair of soft magnetic layers that is formed so as to sandwich the magnetoresistive effect film, a magnetic field which is in a range of from 100 times to 10,000 times an external magnetic field is applied to the magnetoresistive effect film. However, a magnetic field generation source is an external magnetic field such as an automobile axle, a rotary encoder or the like, and a specific relationship concerning a position and dimension of the magnetic field generation source and the pair of soft magnetic layers is not described.

This invention was made to address these problems and proposes a thin film magnetic element that can broaden a frequency band that can be used while reducing a coil input current, which was conventionally difficult.

A thin film magnetic element related to this invention that should accomplish the above-described object comprises:

a magnetoresistive effect film provided with (i) a magnetization fixed layer and (ii) a magnetization free layer via a non-magnetic spacer layer therebetween;

a pair of electrodes arranged via the magnetoresistive effect film in a lamination direction of the magnetoresistive effect film;

a pair of first soft magnetic layers that are separated from the magnetoresistive effect film and are arranged opposite to each other so as to sandwich the magnetoresistive effect film;

a second soft magnetic layer that is more separated from the magnetoresistive effect film than the first soft magnetic layers, a part of the second soft magnetic layer being arranged opposite to the pair of first soft magnetic layers in the lamination direction; and a coil that is formed and wound about the second soft magnetic layer, wherein when a rear end region cross-sectional area of the first soft magnetic layers is defined as S1r and a tip end region cross-sectional area of the second soft magnetic layer is defined as S2f, a relationship of S2f>S1r is satisfied, and when a tip end width of the first soft magnetic layers is defined as W1f and a rear end width of the first soft magnetic layers is defined as W1r, a relationship of W1r>W1f is satisfied.

In the thin film magnetic element that should accomplish the above-described object, when a tip end width of the second soft magnetic layer is W2f, a relationship of W1r>W2f is satisfied.

In the thin film magnetic element that should accomplish the above-described object, when an intermediate width of the first soft magnetic layers is defined as W1m, a relationship with the tip end width W2f of the second soft magnetic layer satisfies a relationship of W1m>W2f.

In the thin film magnetic element that should accomplish the above-described object, a saturation magnetic flux density of the first soft magnetic layers is larger than that of the second soft magnetic layer.

According to a thin film magnetic element related to this invention, the second soft magnetic layer can be arranged at a position sufficiently separated from the magnetoresistive effect film, so a cross-sectional area of the second soft magnetic layer can be made sufficiently larger than that of the first soft magnetic layers. Therefore, even if the coil input current is set to be low, a large amount of magnetic flux can be induced in the second soft magnetic layer. Additionally, by making a first soft magnetic layer rear end region width larger than a second soft magnetic layer tip end region width, a magnetic flux that is discharged from the second soft magnetic layer tip end region can be transmitted to the first soft magnetic layer rear end region. The transmitted magnetic flux can be concentrated in the first soft magnetic layer tip end region, so a strong magnetic field can be applied to the magnetoresistive effect film from the first soft magnetic layer tip end region. Thus, the thin film magnetic element related to this invention can be used in a wide frequency band, even if the coil input current is set to be low. Because of this, a new device can be created in which, for example, a GPS signal (1.5 GHz band) and a WLAN signal (2.4 GHz band) can be received by one element.

DETAILED DESCRIPTION OF EMBODIMENTS

The following explains details of an embodiment of this invention with reference to the drawings.

Figure 1:
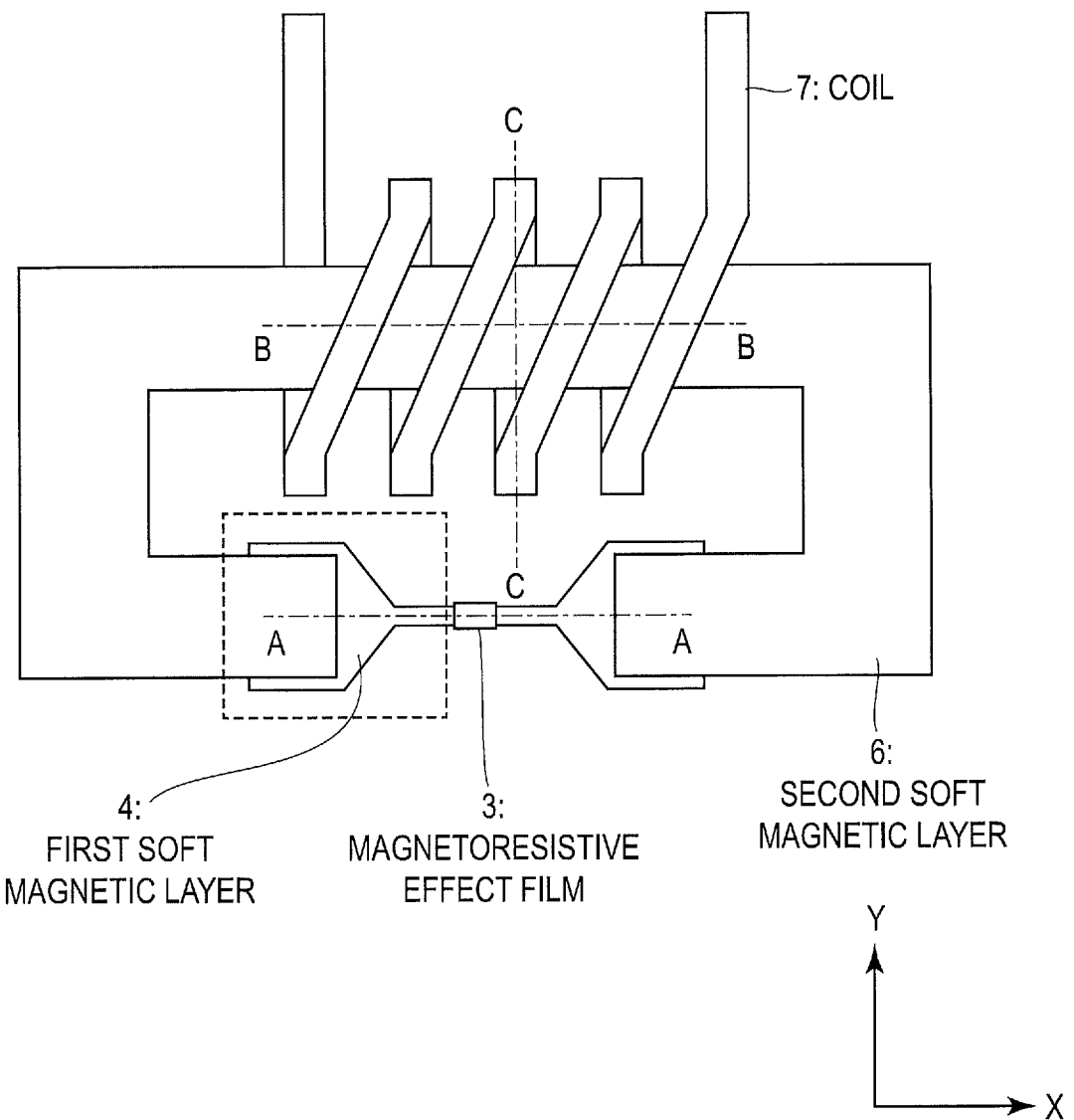
FIG. 1 is a plan view of a thin film magnetic element related to an example of embodiments of this invention.
Figure 2:
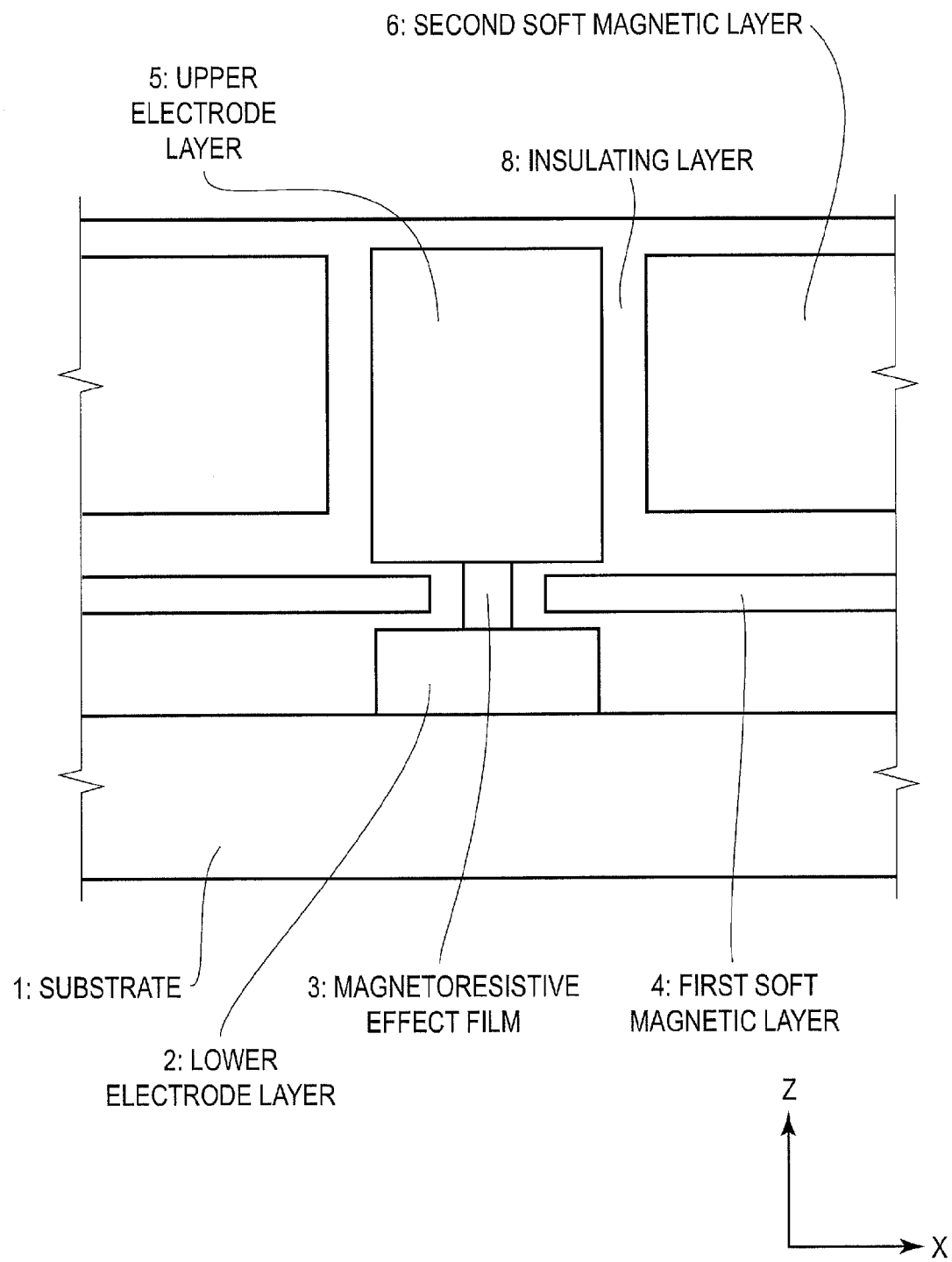
FIG. 2 is a cross-sectional view along line A-A of FIG. 1.
Figure 3:
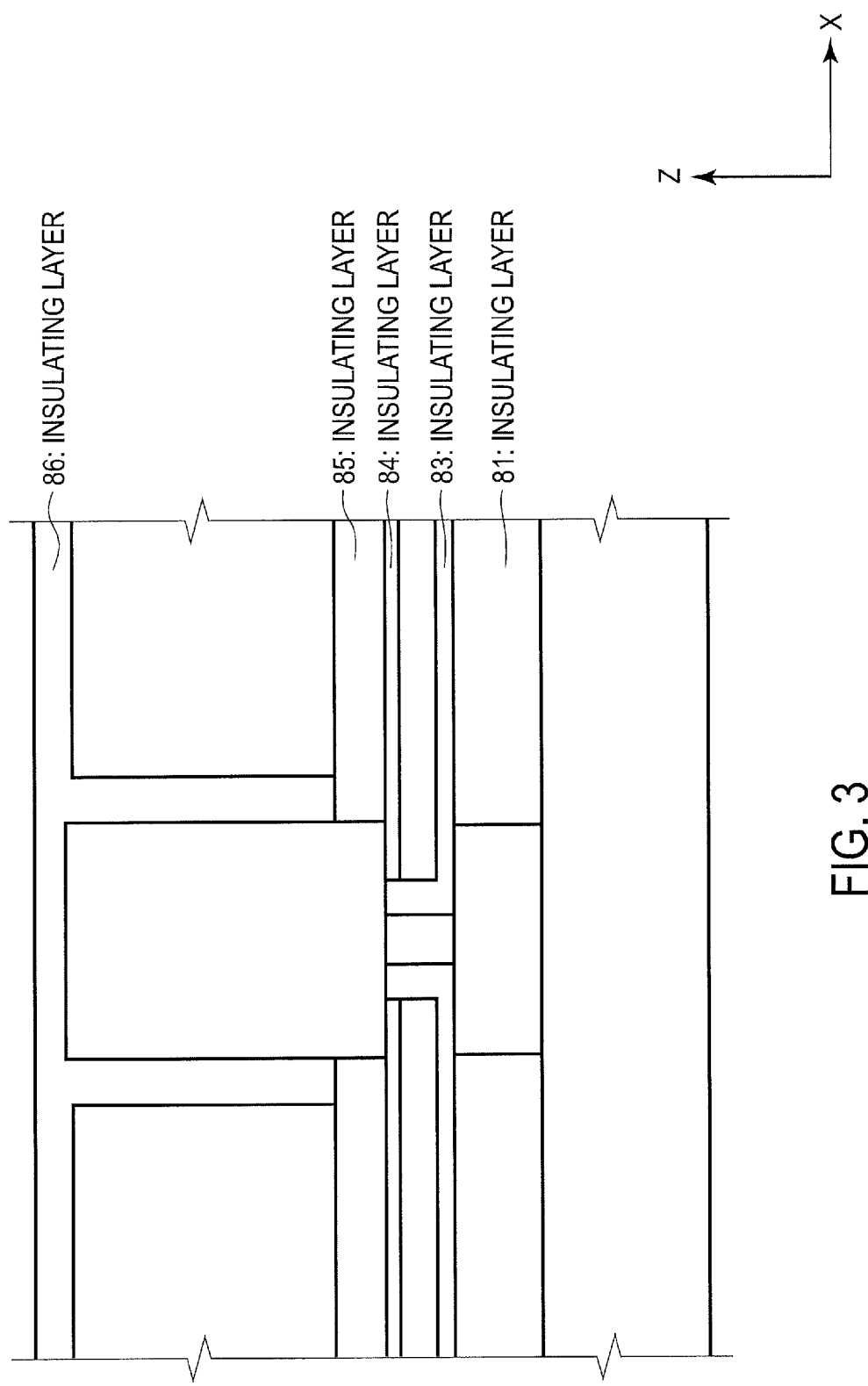
FIG. 3 is a diagram showing details of each portion of an insulating layer of FIG. 2.
Figure 4:
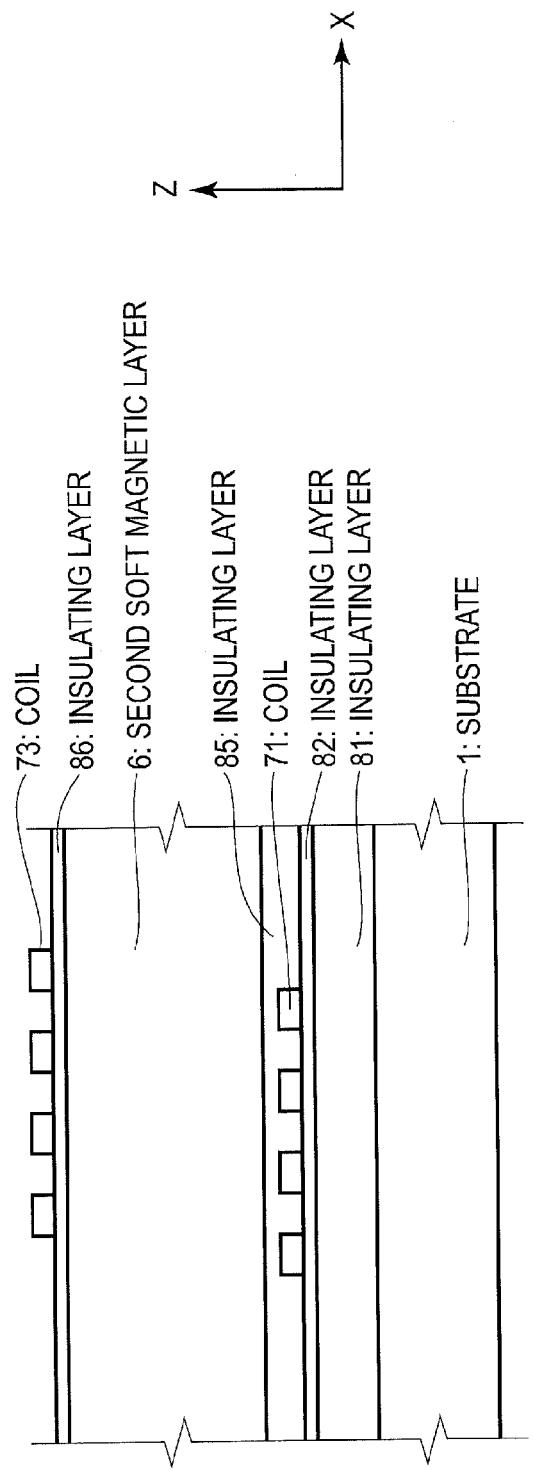
FIG. 4 is a cross-sectional view along line B-B of FIG. 1.
Figure 5:
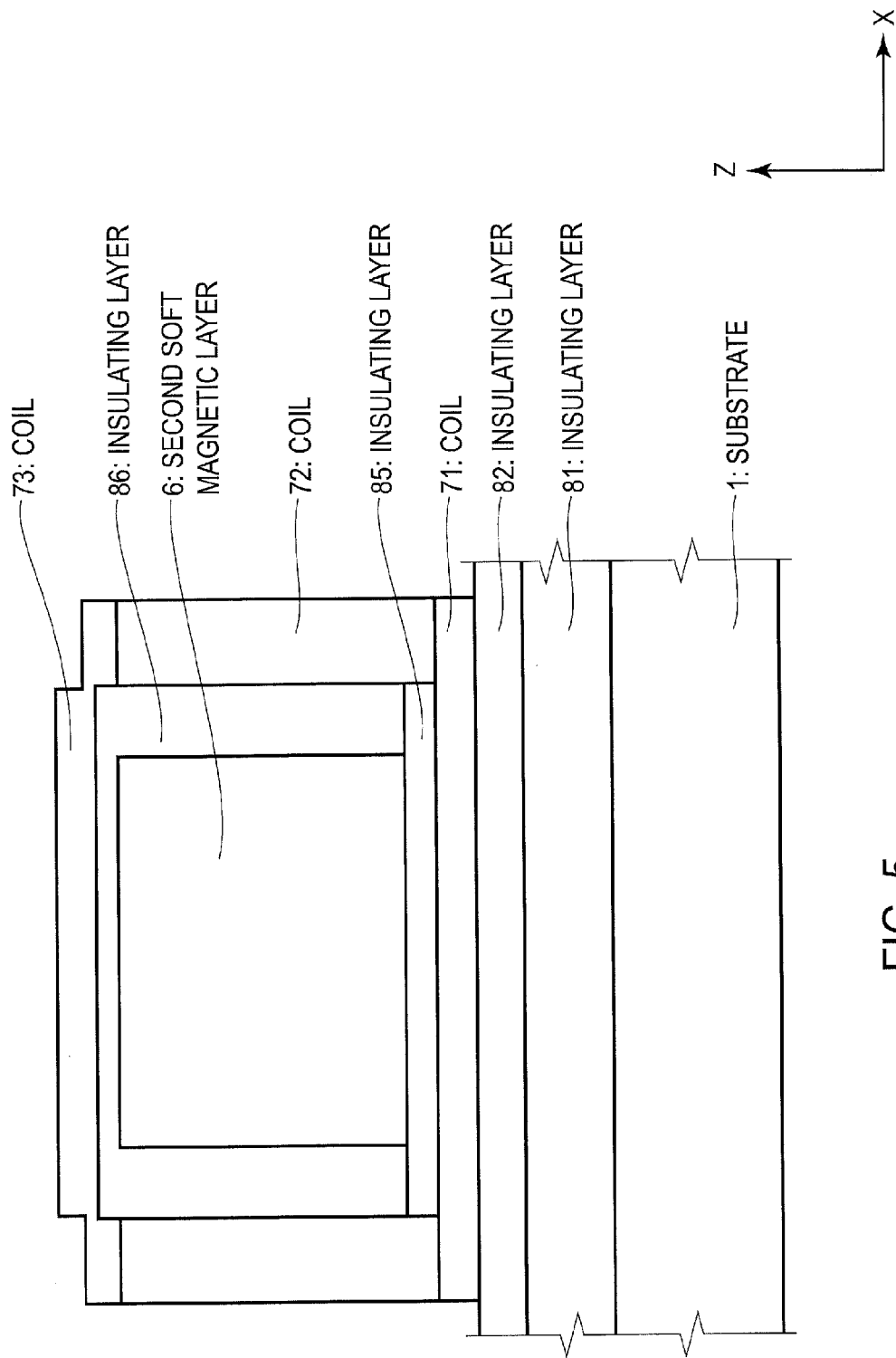
FIG. 5 is a cross-sectional view along line C-C of FIG. 1.
Figure 6:
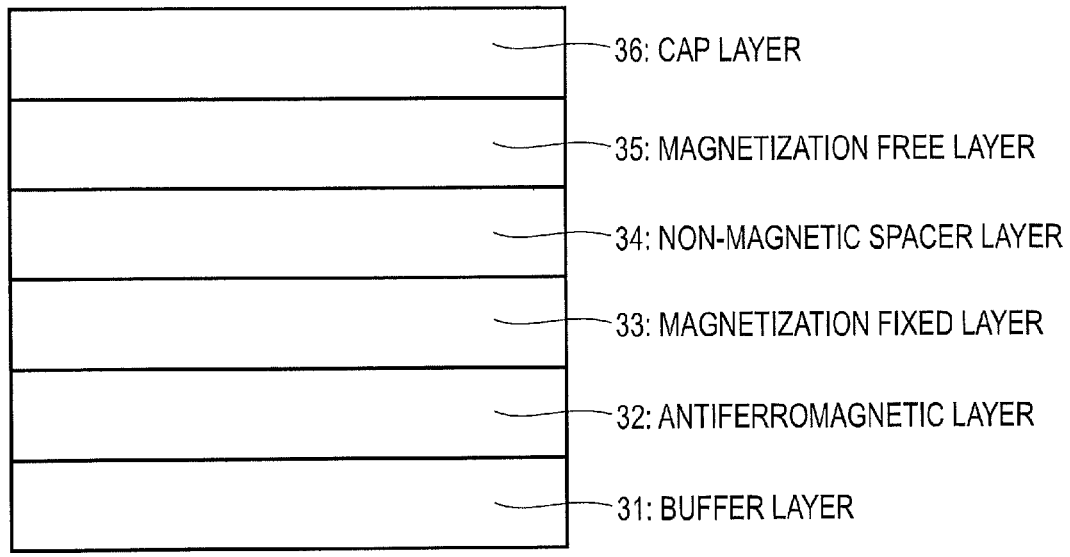
FIG. 6 is a diagram showing a detailed laminated layer structure of a magnetoresistive effect film of FIG. 1.

First, with reference to FIGS. 1-6, a structure of a thin film magnetic element related to an embodiment of this invention is explained. FIG. 1 is a plan view of the thin film magnetic element. FIG. 2 is a cross-sectional view along line A-A of FIG. 1. FIG. 3 is a diagram showing details of each portion of an insulating layer of FIG. 2. FIG. 4 is a cross-sectional view along line B-B of FIG. 1. FIG. 5 is a cross-sectional view along line C-C of FIG. 1. FIG. 6 is a diagram showing a detailed laminated layer structure of a magnetoresistive effect film 3 of FIG. 1. Additionally, the portions that are not important in terms of understanding this invention are partially omitted from FIG. 1.

In FIG. 1, there are arranged (i) a magnetoresistive effect film 3, (ii) a pair of first soft magnetic layers 4 that are arranged opposite to each other so as to sandwich the magnetoresistive effect film 3, (iii) a second soft magnetic layer 6 that is more separated from the magnetoresistive effect film 3 than the first soft magnetic layers 4, and which has a part arranged opposite to the first soft magnetic layers 4 in a lamination direction with respect to a lamination surface of the magnetoresistive effect film 3, and (iv) a coil 7 that is windingly formed about the second soft magnetic layer 6.

In FIG. 2, a lower electrode layer 2, the magnetoresistive effect film 3, and an upper electrode layer 5 are arranged on a substrate 1 in this order. The first soft magnetic layers 4 are arranged at both sides of the magnetoresistive effect film 3 in an X direction. The second soft magnetic layer 6 is arranged at both sides of the upper electrode 5 in the X direction. Additionally, an insulating layer 8 is arranged between the respective layers.

FIG. 3 shows details of each portion of the insulating layer 8 of FIG. 2. An insulating layer 81, an insulating layer 83, an insulating layer 84, an insulating layer 85, and an insulating layer 86 are arranged from the substrate 1 side.

In FIG. 4, the insulating layer 81, an insulating layer 82, a coil 71, the insulating layer 85, the second soft magnetic layer 6, the insulating layer 86, and a coil 73 are arranged on the substrate 1 in this order.

In FIG. 5, the insulating layer 81, the insulating layer 82, the coil 71, the insulating layer 85, a coil 72, the second soft magnetic layer 6, the insulating layer 86, and the coil 73 are arranged on the substrate 1.

FIG. 6 shows a detailed laminated structure of the magnetoresistive effect film 3. A buffer layer 31, an antiferromagnetic layer 32, a magnetization fixed layer 33, a non-magnetic spacer layer 34, a magnetization free layer 35, and a cap layer 36 are arranged in this order.

The following explains each layer.

A silicon substrate having a smooth surface is prepared as the substrate 1. This silicon substrate can be purchased as a commercial product, and has an outside diameter of 150 mm and a thickness of approximately 2 mm. The substrate 1 may be constituted by a material such as, for example, AlTiC ($Al_2O_3 \cdot TiC$), glass (SiOx), carbon (C), or the like. Additionally, a silicon substrate or a glass substrate in which a substrate surface is thermally oxidized in advance can also be used as the substrate 1. Furthermore, although undepicted, an insulating layer can also be formed on the surface of the substrate 1. The insulating layer functions so as to suppress a transmission loss of a high frequency from being generated because a capacitor component is generated between the substrate 1 and the lower electrode 2 by flow of a current from the lower electrode layer 2, which is described hereafter, to the substrate 1. The insulating layer is constituted by a non-magnetic insulating material such as aluminum oxide ($Al_2O_3$) or silicon oxide ($SiO_2$), using, for example, a sputtering method, an IBD (ion beam deposition) method, or the like. The thickness is preferably in a range of from approximately 0.05 μm to approximately 10 μm.

The lower electrode layer 2 has a role of being an electrode which is paired with the upper electrode layer 5, which will be described hereafter. That is, they have a function as a pair of electrodes that causes a current to flow in a direction crossing a plane of the various layers that constitute an element, for example, in a direction perpendicular (lamination direction) to a plane of the various layers that constitute the element.

The lower electrode layer 2 and the upper electrode layer 5 that are thus described are constituted by Ta, Cu, Au, AuCu, Ru, or by any two or more of these materials, by using, for example, a sputtering method, an IBD method, or the like. A film thickness of the lower electrode layer 2 and the upper electrode layer 5 is preferably within a range of from approximately 0.05 μm to approximately 5 μm. In a thin film magnetic element, in order to reduce transmission loss, a shape of an electrode layer becomes important. In this embodiment, the shape of the lower electrode layer 2 and the shape of the upper electrode layer 5, as seen from above the element, are controlled to be a shape of a coplanar wave guide (CPW), using known photoresist patterning, ion beam etching, or the like.

The magnetoresistive effect film 3 is formed by the buffer layer 31, the antiferromagnetic layer 32, the magnetization fixed layer 33, the non-magnetic spacer layer 34, the magnetization free layer 35, and the cap layer 36. Each layer is formed in a film by using, for example, a sputtering film deposition device. For a sputtering film deposition device, a device is preferable, which is provided with (i) two physical vapor deposition (PVD: Physical Vapor Deposition) chambers each of which has eight targets and (ii) an oxidation chamber. For example, C-7100, manufactured by ANELVA CORPORATION, or the like can be used. It is preferable that at least one of the plurality of PVD chambers can perform simultaneous sputtering. Sputtering film formation is performed by sputtering a target formed of a metal or an alloy, using an argon sputtering gas and forming a film on a substrate in an ultrahigh vacuum. At this time, it is preferable that a gas flow amount is in a range of from 30 sccm to 300 sccm, an applied power between the substrate and the target is in a range of from 50 W to 500 W, and a vacuum degree is $5.0 \times 10^{-6}$ Pa or lower.

The buffer layer 31 is a layer that shields crystallinity of the lower electrode layer 2 and controls orientation and grain diameter of the antiferromagnetic layer 32. The buffer layer 31 is particularly arranged so as to make exchange coupling of the antiferromagnetic layer 32 and the magnetization fixed layer 33 preferable.

For the buffer layer 31, for example, a film of Ta and NiCr or a film of Ta and Ru are preferable. It is preferable that a film thickness of the buffer layer 31 is, for example, in a range of from approximately 2 nm to approximately 6 nm.

An object of the antiferromagnetic layer 32 is to apply unidirectional magnetic anisotropy to the magnetization fixed layer 33 by exchange coupling with the magnetization fixed layer 33.

The antiferromagnetic layer 32 is constituted by, for example, an antiferromagnetic material including (i) an element formed of at least one type selected from among the group of Pt, Ru, Rh, Pd, Ni, Cu, Ir, Cr and Fe, and (ii) Mn. It is preferable that the Mn content is in a range of from 35 at % to 95 at %. Among antiferromagnetic materials, there are (i) non-heat treated antiferromagnetic materials that show antiferromagnetic properties even without heat treatment and induce exchange coupling among ferromagnetic materials and (ii) heat treated antiferromagnetic materials that show antiferromagnetic properties through heat treatment. In this invention, either of these types can be used. RuRhMn, FeMn, IrMn, or the like can be listed as examples of non-heat treated antiferromagnetic materials. PtMn, NiMn, PtRhMn, or the like can be listed as examples of heat treated antiferromagnetic materials. Additionally, even in a non-heat treated antiferromagnetic material, heat treatment is usually performed so as to make directions of exchange coupling uniform. It is preferable that a film thickness of the antiferromagnetic layer 32 is in a range of from approximately 4 nm to approximately 30 nm.

Furthermore, for a layer that fixes a magnetization direction of the magnetization fixed layer 33, it is also acceptable to arrange a hard magnetic layer formed of a hard magnetic material such as CoPt instead of the antiferromagnetic layer.

Additionally, FIG. 6 shows an embodiment in which the antiferromagnetic layer 32 is formed on a bottom side (lower electrode layer 2 side), but an embodiment can also be made in which the antiferromagnetic layer 32 is formed on a top side (cap layer 36 side) and the position of the magnetization free layer 35 and the position of the magnetization fixed layer 33 are replaced with each other.

The magnetization fixed layer 33 is formed on the antiferromagnetic layer 32, which performs a pinning action. In a preferred mode, the magnetization fixed layer 33 is constituted such that an outer layer, a non-magnetic intermediate layer, and an inner layer, which are not depicted, are laminated in order from the antiferromagnetic layer 32 side, that is, the magnetization fixed layer 33 forms a synthetic pinned layer.

The outer layer and the inner layer are constituted so as to be provided with a ferromagnetic layer formed of a ferromagnetic material including, for example, Co or Fe. The outer layer and the inner layer are antiferromagnetically coupled and are fixed such that their magnetization directions are opposite to each other.

It is preferable that the outer layer and the inner layer should be provided with (i) a structure in which, for example, a first CoFe alloy and a second CoFe alloy with a different composition are laminated, and (ii) a structure in which a CoFeB alloy and a CoFe alloy are laminated. It is preferable that a film thickness of the outer layer is in a range of from approximately 1 nm to approximately 7 nm and that a film thickness of the inner layer is in a range of from approximately 2 nm to approximately 10 nm. The inner layer may include a Heusler alloy.

The non-magnetic intermediate layer is constituted by, for example, a non-magnetic material including at least one type selected from among the group of Ru, Rh, Ir, Re, Cr, Zr, and Cu. A film thickness of the non-magnetic intermediate layer is, for example, in a range of from approximately 0.35 nm to approximately 1.0 nm. The non-magnetic intermediate layer is arranged so as to fix the magnetization of the inner layer and the magnetization of the outer layer in directions opposite to each other. "Magnetization directions opposite to each other" is not narrowly construed to refer only to the case in which these two magnetizations are 180° different from each other, but refers to a broad concept, also including a case in which they are 180°±20° different from each other.

The non-magnetic spacer layer 34 is a layer for obtaining a magnetoresistive effect by causing the magnetization of the magnetization fixed layer 33 and the magnetization of the magnetization free layer 35 to interact.

An insulator, a semiconductor, and a conductor are listed as examples of the non-magnetic spacer layer 34.

If an insulator is applied as the non-magnetic spacer layer 34, $Al_2O_3$ and magnesium oxide (MgO) are listed as examples. Single crystal MgOx (001) is preferable for MgO. It is more preferable that a high magnetoresistive changing rate is obtained by making adjustments so as to expect a coherent tunnel effect between the non-magnetic spacer layer 34 and the magnetization free layer 35. It is preferable that a film thickness of the insulator is in a range of from approximately 0.5 nm to approximately 2.0 nm.

If a semiconductor is applied as the non-magnetic spacer layer 34, a structure is preferable in which a first non-magnetic metal layer, a semiconductor oxide layer, and a second non-magnetic metal layer are laminated in order from the magnetization fixed layer 33. Cu and Zn are listed as examples of the first non-magnetic metal layer. It is preferable that a film thickness of the first non-magnetic metal layer is in a range of from approximately 0.1 nm to approximately 1.2 nm. Zinc oxide (ZnO), indium oxide ($In_2O_3$), tin oxide ($SnO_2$), indium tin oxide (ITO: Indium Tin Oxide), and gallium oxide ($GaO_x$ or $Ga_2O_x$) are listed as examples of the semiconductor oxide layer. It is preferable that a film thickness of a semiconductor oxide layer is in a range of from approximately 1.0 nm to approximately 4.0 nm. Zn, an alloy of Zn and Ga, a film of Zn and GaO, Cu, and an alloy of Cu and Ga are listed as examples of the second non-magnetic metal layer. It is preferable that a film thickness of a second non-magnetic metal layer is in a range of from approximately 0.1 nm to approximately 1.2 nm.

If a conductor is applied as the non-magnetic spacer layer 34, Cu and Ag are listed as examples. It is preferable that a film thickness of a conductor is in a range of from approximately 1 nm to approximately 4 nm.

The magnetization free layer 35 is a layer in which the magnetization direction changes due to an external magnetic field or a spin-polarized electron.

The magnetization free layer 35 is constituted by a film in a thickness range of from approximately 1 nm to approximately 10 nm, formed of, for example, CoFe, CoFeB, CoFeSi, CoMnGe, CoMnSi, CoMnAl, or the like, if a material is selected that is provided with an axis of easy magnetization in a direction within a plane of the film. As a magnetostriction control layer, a soft magnetic film, formed of, for example, NiFe, whose thickness is in a range of from approximately 1 nm to approximately 9 nm, can also be added to the film of the magnetization free layer 35.

If a material is selected that is provided with an axis of easy magnetization in a direction normal to the film plane, the magnetization free layer 35 is constituted by, for example, Co, a Co/non-magnetic layer laminated film, a CoCr alloy, a Co multilayer film, a CoCrPt alloy, an FePt alloy, an SmCo alloy including a rare-earth element, a TbFeCo alloy, or a Heusler alloy.

Additionally, a high spin polarization material can be inserted between (i) the laminated structure of the magnetization free layer 35 and (ii) the non-magnetic spacer layer 34. By so doing, a high magnetoresistive changing rate can be obtained.

A CoFe alloy and a CoFeB alloy are listed as examples of high spin polarization materials. It is preferable that the film thickness of both a CoFe alloy and a CoFeB alloy is in a range of from 0.2 nm to 1 nm.

Additionally, induced magnetism anisotropy can also be introduced by applying a constant magnetic field in a direction perpendicular to a plane of the film when the film of the magnetization free layer 35 is formed.

An object of the cap layer 36 is to protect the magnetization free layer 35 from oxidation and etching. It is preferable that the cap layer 36 is a film in which, for example, Ru, Ta, Ru, and Ta are laminated. It is preferable that a film thickness is in a range of from approximately 2 nm to approximately 10 nm.

After the film of the cap layer 36 is formed, annealing is performed for magnetization fixing of the magnetization fixed layer 33. It is preferable that the annealing is performed in a condition in which a vacuum degree is $1.0 \times 10^{-3}$ Pa or lower, temperature is in a range of from 250° C. to 300° C., time period is from 1 hour to 5 hours, and an applied magnetic field is in a range of from 3 kOe to 10 kOe.

After annealing, known photoresist patterning, ion beam etching, or the like is performed, and the shape seen from above the magnetoresistive effect film 3 is patterned into a round shape, an elliptical shape, a rectangular shape, or the like. It is preferable that the dimension is 100 nm or less.

The first soft magnetic layer 4 is a layer that takes in a magnetic flux that is discharged from the second soft magnetic layer 6, which will be described hereafter, concentrates the magnetic flux and sets a desired magnetic field, and applies the magnetic field to the magnetoresistive effect film 3. It is preferable that the first soft magnetic layer 4 is arranged so as to be as close as possible to the magnetoresistive effect film 3.

For a material of the first soft magnetic layer 4, it is preferable that a soft magnetic material that is excellent in a soft magnetic characteristic is used by, for example, a sputtering method, an IBD method, or the like. For this type of soft magnetic material, an NiFe alloy such as NiFe, CoNiFe, NiFeX (X═Ta, Nb, Mo) or the like, an FeCo alloy, CoZrNb, CoAl—O, Fe—SiO$_2$, CoFeB, or the like are listed as examples. It is more preferable that a saturation magnetic flux density of the material of the first soft magnetic layer 4 is made larger than that of the material of the second soft magnetic layer 6, which will be described hereafter. Additionally, it is preferable that a film thickness of the first soft magnetic layer 4 is in a range of approximately 5 nm to approximately 30 nm.

The second soft magnetic layer 6 is a layer that induces a magnetic flux generated from the coil 7, which will be described hereafter, to the first soft magnetic layer 4. It is preferable that the second soft magnetic layer 6 is more separated from the magnetoresistive effect film 3 than the first soft magnetic layer 4, and a part of the second soft magnetic layer 6 is arranged opposite to the first soft magnetic layer 4 in a laminated layer direction with respect to a lamination plane of the magnetoresistive effect film 3. By having the second soft magnetic layer 6 arranged this way, manufacturing restrictions will be relaxed, and a cross-sectional area of the second soft magnetic layer 6 can be made larger than that of the first soft magnetic layer 4.

As a material of the second soft magnetic layer 6, it is preferable that it is constituted by a soft magnetic material that is excellent in a soft magnetic characteristic by, for example, a sputtering method, an IBD method, a frame plating method, or the like. For such a soft magnetic material, an NiFe alloy such as NiFe, NiFeCo, NiFeX (X═Ta, Nb, Mo), an FeCo alloy, CoZrNb, CoAl—O, Fe—SiO$_2$, CoFeB, or the like are listed as examples. It is preferable that a film thickness of the second soft magnetic layer 6 is in a range of from approximately 0.1 μm to approximately 10 μm.

The coil 7 is constituted by coils 71, 72, and 73 and is a layer as a magnetic flux generating source that generates a magnetic flux by application of a current.

The coils 71, 72, and 73 are formed by a high electrical conductivity material such as Au, Cu, AuCu, or the like by, for example, a sputtering method, an IBD method, a frame plating method, or the like. Furthermore, the coils 71, 72, and 73 do not need to be the same material as long as electrical conductivity is ensured. Additionally, the coil 72 can also be constituted by the same material as the second soft magnetic layer 6. In this case, the coil 72 can be manufactured simultaneously with the second magnetic layer 6, so the manufacturing process can be simplified. It is preferable that a film thickness of the coils 71, 72, and 73 is in a range of from approximately 0.1 μm to approximately 10 μm. Additionally, the coil 7 has a structure that is wound about the second soft magnetic layer 6 (spiral structure). Furthermore, the number of windings of the coil 7 (the number of turns) can be arbitrarily set.

The insulating layer 8 is constituted by the insulating layers 81, 82, 83, 84, 85, and 86, and is a layer that provides electrical insulation between the above-mentioned arbitrary layers.

The insulating layer 8 is constituted by a non-magnetic insulating material, for example, Al$_2$O$_3$ or SiO$_2$, a photoresist or spin on glass (SOG) that exhibits flowability at the time of heating, or the like, by, for example, a sputtering method, an IBD method, a coating method, or the like. Additionally, it is also acceptable to use a plurality of the non-magnetic insulating materials listed above for the insulating layer 8. It is preferable that a film thickness of the insulating layer 8 is in a range of from approximately 0.005 μm to approximately 10 μm. Additionally, after the film of the insulating layer 8 is formed, planar processing may be performed by chemical-mechanical polishing (CMP) or the like so as to increase the flatness of the film.

Each layer is patterned by known photoresist patterning, ion beam etching, a lift-off method, or the like.

Figure 7:
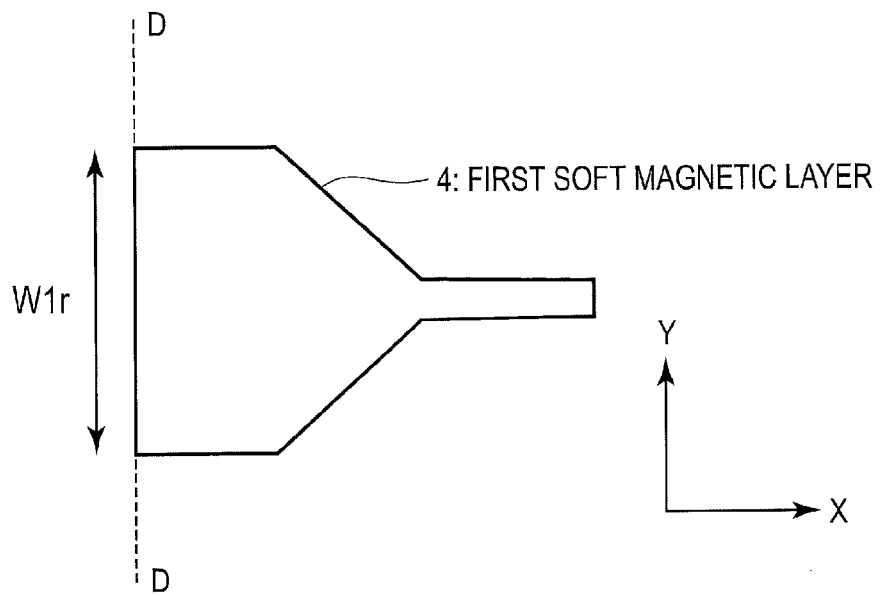
FIG. 7 is a plan view of a first soft magnetic layer.
Figure 8:
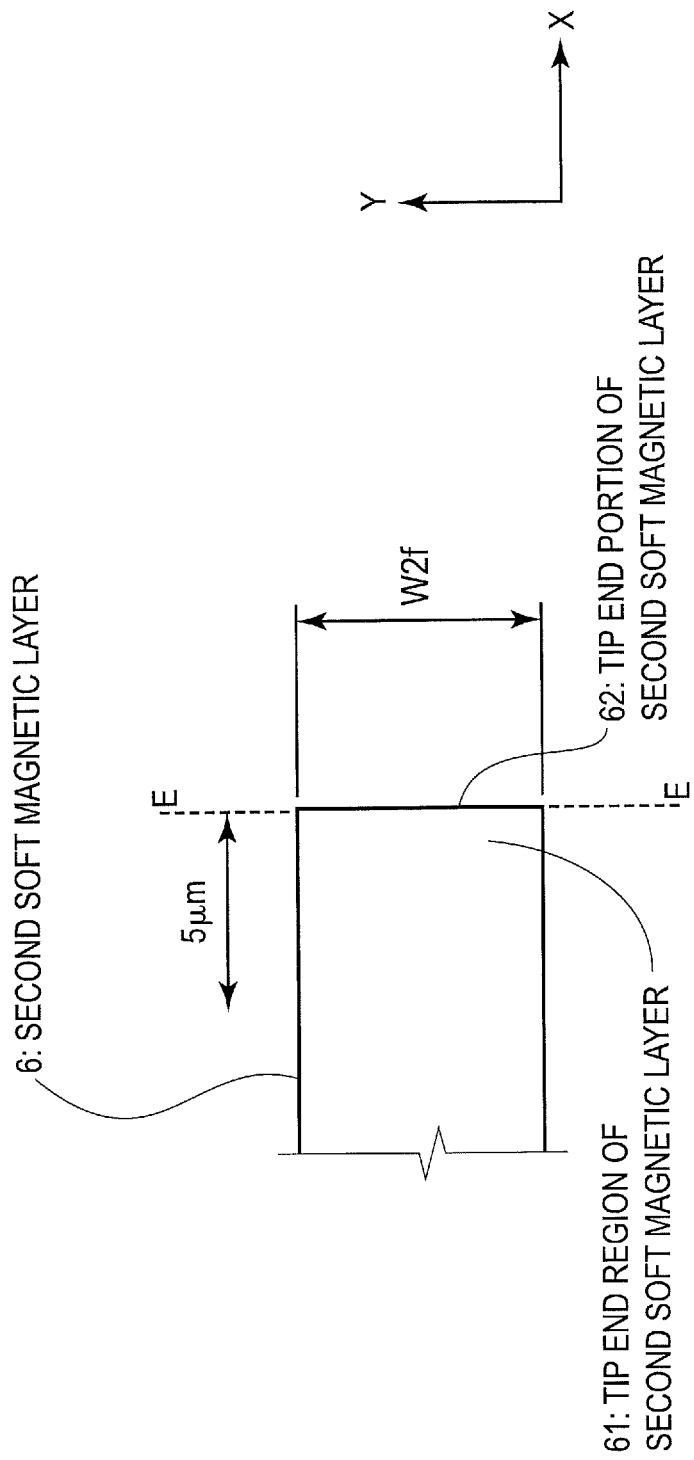
FIG. 8 is a plan view of a second soft magnetic layer tip end region.
Figure 9:
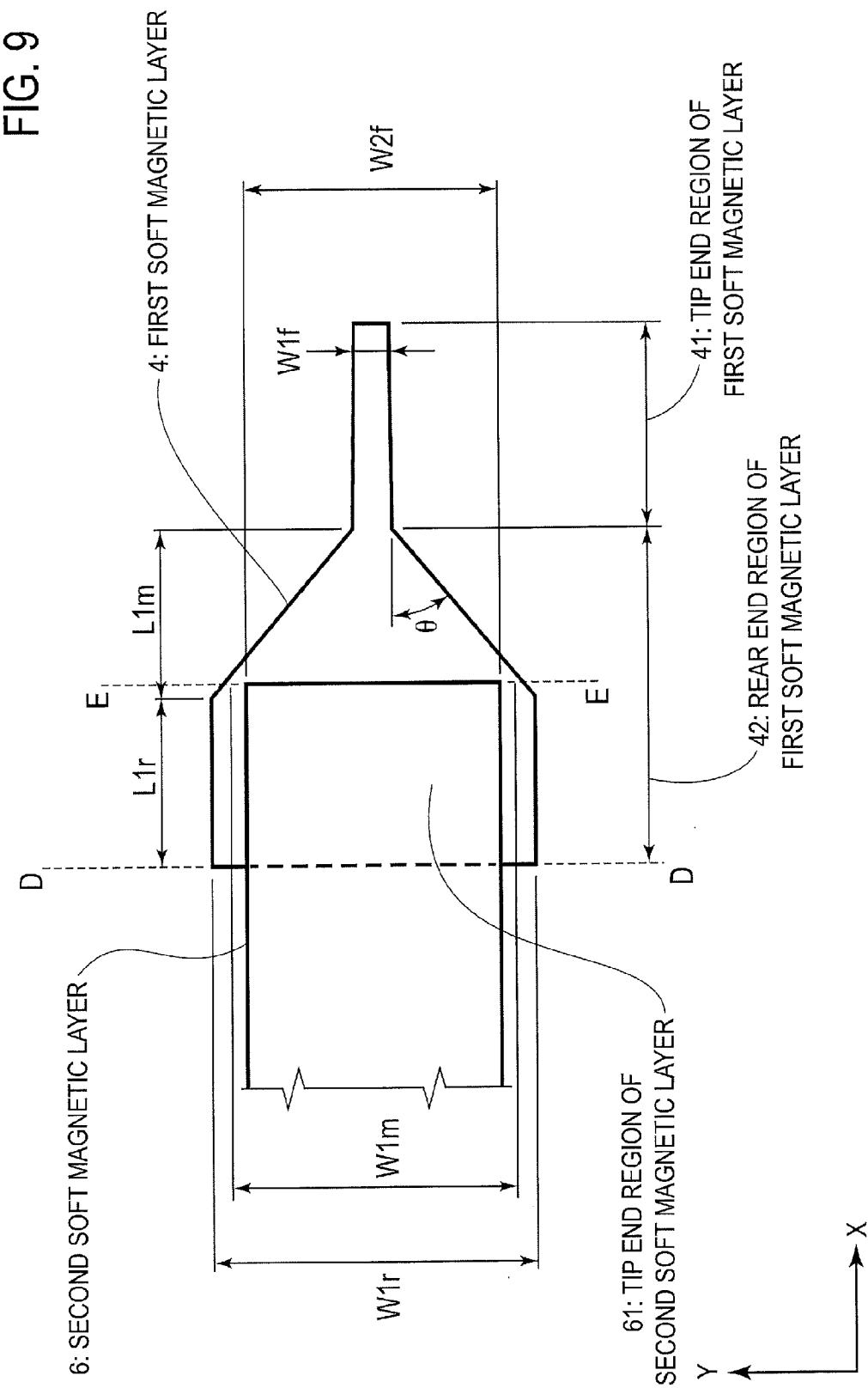
FIG. 9 is a plan view of the portion of FIG. 1 surrounded by broken lines.

Here, the dimensions defined by the first soft magnetic layer 4 and the second soft magnetic layer 6 are explained, using FIGS. 7, 8, and 9.

FIG. 7 shows a plan view of the first soft magnetic layer 4. A rear end region cross-sectional area S1r of the first soft magnetic layer refers to an area of a cross-sectional portion along line D-D of FIG. 7. Additionally, a rear end width W1r of the first soft magnetic layer refers to a Y direction length along line D-D.

FIG. 8 shows a plan view in the vicinity of a tip end region of the second soft magnetic layer 6. A tip end region 61 of the second soft magnetic layer refers to a region that enters the second soft magnetic layer for 5 μm in an X direction from a tip end portion 62 of the second soft magnetic layer. A tip end region cross-sectional area S2f of the second soft magnetic layer refers to an area showing a maximum area of the cross-sectional portion of the tip end region 61 of the second soft magnetic layer. Additionally, a tip end width W2f of the second soft magnetic layer refers to a Y direction length along line E-E.

FIG. 9 shows a plan view of the portion of FIG. 1 that is surrounded by broken lines. The first soft magnetic layer 4 is divided into (i) a tip end region 41 of the first soft magnetic layer and (ii) a rear end region 42 of the first soft magnetic layer. A first soft magnetic layer intermediate width W1m refers to a Y direction length of the rear end region 42 of the first soft magnetic layer along line E-E. There may be cases that W1m is equal to W1r. In the rear end region 42 of the first soft magnetic layer, a region is arranged in which the Y direction length becomes shorter approaching the tip end region 41 of the first soft magnetic layer. The X direction length of this region is L1m, and an angle with respect to the X direction is θ. It is preferable that the angle θ is in a range of from approximately 10° to approximately 80°. Additionally, a length L1r is the X direction length of the rear end region 42 of the first soft magnetic layer minus L1m. There are also cases that L1r is zero. Furthermore, the first soft magnetic layer tip end width W1f refers to the Y direction length of the tip end region 41 of the first soft magnetic layer.

In this invention, it is preferable that S2f is larger than S1r. By so doing, the magnetic flux discharged from the tip end region 61 of the second soft magnetic layer is made large. Additionally, because S2f is larger than S1r, the magnetic flux that is discharged from the tip end region 61 of the second soft magnetic layer can be made to concentrate at the rear end region 42 of the first soft magnetic layer. Thus, a magnetic flux density of the rear end region 42 of the first soft magnetic layer can be increased. Additionally, it is preferable that W1r is made larger than W1f. By so doing, a magnetic flux density at the tip end region 41 of the first soft magnetic layer can be increased.

Additionally, it is preferable that W1r is made larger than W2f. By so doing, a magnetic flux propagation loss when the magnetic flux discharged from the tip end region 61 of the second soft magnetic layer is propagated to the rear end region 42 of the first soft magnetic layer can be suppressed.

Additionally, it is preferable that W1m is made larger than W2f. By so doing, a magnetic flux propagation loss when the magnetic flux discharged from the tip end region 61 of the second soft magnetic layer is propagated to the rear end region 42 of the first soft magnetic layer can be suppressed.

With respect to a thin film magnetic element manufactured by the above method, a spin-torque diode output was measured while an arbitrary current was flowing to the coil 7. The following explains a spin-torque diode output.

If an alternating current at a high frequency flows into the magnetoresistive effect film 3, when the frequency of the alternating current that flows to the magnetization free layer 35 matches the vibration frequency of spin precession that attempts to return to the magnetization direction, strong resonance is generated (spin-torque ferromagnetic resonance). Additionally, in a state in which a static magnetic field is applied to the magnetoresistive effect film 3, and a direction of this static magnetic field is inclined at a specified angle within a layer with respect to a direction of magnetization of the magnetization fixed layer, when an RF (radio frequency) current (an RF current at a frequency that matches the vibration frequency (resonance frequency) of the spin precession) is injected to the magnetoresistive effect film 3, a second-order wave-detecting output that generates, at both ends of the magnetoresistive effect film 3, a direct current voltage proportional to the square of the amplitude of the injected RF current is called a "spin-torque diode output."

According to the following procedure, the spin-torque diode output is measured. First, an arbitrary current is caused to flow to the coil 7. Then, a magnetic flux that corresponds to the current amount is generated from the coil. The magnetic flux generated from the coil 7 is propagated through the second soft magnetic layer 6 and is discharged from the tip end region 61 of the second soft magnetic layer. The magnetic flux discharged from the tip end region 61 of the second soft magnetic layer is propagated to the first soft magnetic layer 4 via the insulating layers 85 and 84. The density of the magnetic flux propagated to the first soft magnetic layer 4 is concentrated from the rear end region 42 of the first soft magnetic layer toward the tip end region 41 of the first soft magnetic layer. As a result, in the tip end region 41 of the first soft magnetic layer, the density becomes a desired magnetic flux density, and a desired magnetic field is applied to the magnetoresistive effect film 3 from the tip end region 41 of the first soft magnetic layer. Here, the current amount is defined as a positive value when the current flows to the coil 7 so as to apply a magnetic field in the +X direction of FIG. 1. In a state in which the magnetic field is applied, 0.1 mW of power is applied between the lower electrode layer 2 and the upper electrode layer 5, and the spin-torque diode output is measured. Then, a frequency when a maximum value of the spin-torque diode output is shown (hereafter referred to as a "peak frequency") can be obtained. The difference between a peak frequency when the magnetic field is applied and a peak frequency when there is no magnetic field is defined as a "frequency shift amount." In this invention, an optimal structure is proposed for making the frequency shift amount large while making the current that is input to the coil 7 (hereafter referred to as a "coil input current") small.

Next, modes of this invention are more specifically explained, using embodiments, but this invention is not limited to these embodiments.

First Embodiment

First, as a substrate 1, a silicon substrate was prepared, with an outer diameter of 6 inches, a thickness of 2 mm, and having a thermal oxide film (1 μm) arranged on the substrate surface in advance.

Next, a Cu film (90 nm) was formed as the lower electrode layer 2 by a sputtering method. Then, the lower electrode layer 2 was patterned in a CPW shape by photoresist patterning and ion beam etching. Subsequently, $Al_2O_3$ (90 nm) was formed as the insulating layer 81 by sputtering film deposition and a lift-off method.

Next, the magnetoresistive effect film 3 was formed by a sputtering method. In the magnetoresistive effect film 3, the buffer layer 31 was Ta (1 nm)/Ru (1 nm), the antiferromagnetic layer 32 was IrMn (7 nm), the magnetization fixed layer 33 was Co70Fe30 (3 nm)/Ru (0.8 nm)/Co65Fe35 (3.5 nm), the non-magnetic spacer layer 34 was MgO (1 nm), the magnetization free layer 35 was Co30Fe70 (2 nm)/Ni81Fe19 (4 nm), and the cap layer 36 was Ru (1 nm)/Ta (2 nm)/Ru (2 nm). After film formation, thermal treatment was performed, in a vacuum magnetic field, for magnetization fixing of the magnetization fixed layer. Conditions for this thermal treatment were: a vacuum degree of $5 \times 10^{-4}$ Pa, an applied magnetic field of 10 kOe in a direction parallel to a plane of the film, a temperature of 250 degrees, and a treatment period of 3 hours. After annealing was performed, photoresist patterning and ion beam etching were performed, and the shape as seen from above the element was patterned in a square of 95 nm×95 nm. Subsequently, the insulating layer 82 was formed by an IBD method and a lift-off method. The insulating layer 82 was $Al_2O_3$ (28 nm).

Next, the insulating layer 83, the first soft magnetic layer 4, and the insulating layer 84 were formed in this order by photoresist patterning, ion beam etching, an IBD method, and a lift-off method. The insulating layers 83 and 84 were $Al_2O_3$ (5.5 nm), and the first soft magnetic layer 4 was Ni82Fe18 (17 nm) with a saturation magnetic flux density 0.9 T. By so doing, the first soft magnetic layer 4 was electrically insulated from the lower electrode layer 2, the magnetoresistive effect film 3, the upper electrode layer 5, and the second soft magnetic layer 6. Additionally, the dimensions of the first soft magnetic layer 4 were controlled such that W1f was 0.1 μm, W1r was 12.0 μm, L1m was 5.5 μm, L1r was 4.0 μm, and θ was 47°.

Next, the upper electrode layer 5 and the coil 71 were formed by photoresist patterning, a sputtering method, and a lift-off method. The upper electrode layer 5 and the coil 71 were AuCu (200 nm).

Next, the insulating layer 85 was formed by a sputtering method and a CMP method. The insulating layer 85 was $Al_2O_3$, and was formed so as to maintain 200 nm of the insulating layer 85 on the top layer of the coil 71 after CMP.

Next, the second soft magnetic layer 6 and the coil 72 were formed by photoresist patterning and a frame plating method. The second soft magnetic layer 6 and the coil 72 were Ni82Fe18 (1 μm) with a saturation magnetic flux density 0.9 T.

Next, the insulating layer 86 was formed by a sputtering method and a CMP method. The insulating layer 86 was $Al_2O_3$, and was formed so as to maintain 200 nm of the insulating layer 86 on the top layer after CMP.

Next, the coil 73 was formed by photoresist patterning, a sputtering method, and a lift-off method. The coil 73 was AuCu (200 nm). At this stage, the coils 71, 72, and 73 are electrically connected, and the coil 7 is complete.

Finally, patterning was performed so as to wire an external device to the lower electrode layer 2 and the upper electrode layer 5 by a known technology.

Figure 10:
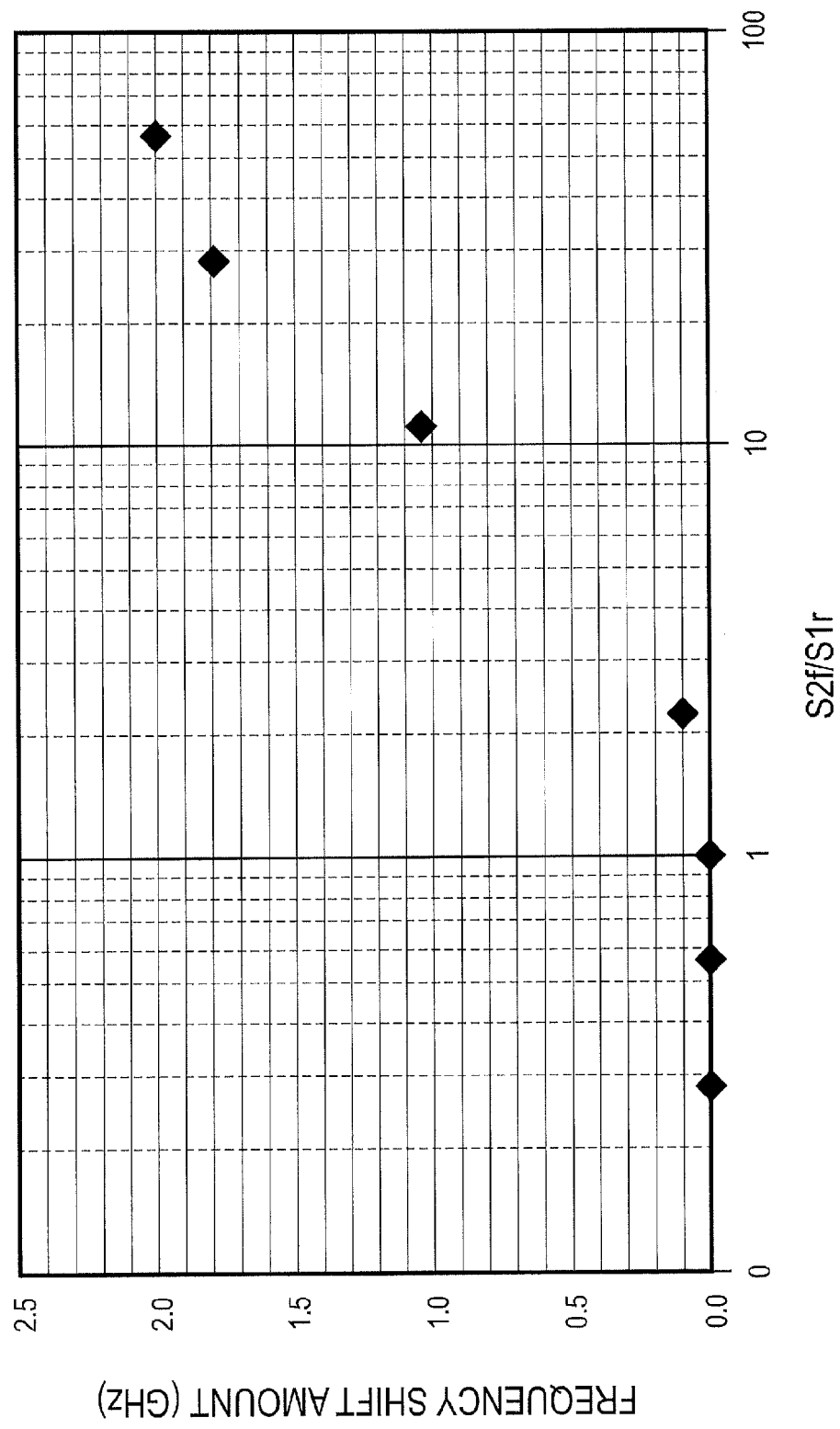
FIG. 10 is a diagram showing a relationship between S2f/S1r and a frequency shift amount when a coil input current is 3 mA.

With this structure, while a current of 3 mA was caused to flow through the coil 7 and the magnetic field was being applied to the magnetoresistive effect film 3, a frequency shift amount was measured when S2f/S1r was changed. FIG. 10 shows the result.

As shown in FIG. 10, in this embodiment, when S2f/S1r was 1 or lower, the frequency shift amount became 0.01 GHz or lower, and there was hardly any frequency shift. It is thought that this is because when S2f/S1r is 1 or lower, the magnetic flux density at the rear end region 42 of the first soft magnetic layer becomes smaller than that at the tip end region 61 of the second soft magnetic layer, the magnetic field that is applied to the magnetoresistive effect film 3 becomes weak. Meanwhile, it was confirmed that the frequency shift amount became large by making S2f/S1r larger than 1. It is thought that this is because when S2f/S1r is larger than 1, the magnetic flux density at the rear end region 42 of the first soft magnetic layer becomes larger than that at the tip end region 61 of the second soft magnetic layer, and the magnetic field that is applied to the magnetoresistive effect film 3 becomes strong. For example, it was confirmed that the frequency shift amount became 0.1 GHz or larger when S2f/S1r is 2 or larger. Additionally, it was confirmed that when S2f/S1r is 11 or larger, the frequency shift amount became 1 GHz or larger.

Comparison Example 1

In the first embodiment, the frequency shift amount was measured when W1f was 12.0 μm, which was the same as W1r, and S2f/S1r was changed. As a result, although undepicted, the frequency shift amount became 0.01 GHz or lower regardless of the value of S2f/S1r. It is thought that this is because by making W1f=W1r, a magnetic flux concentration effect of the tip end region 41 of the first soft magnetic layer was made weak, and the magnetic field that was applied to the magnetoresistive effect film 3 became weak.

Second Embodiment

Figure 11:
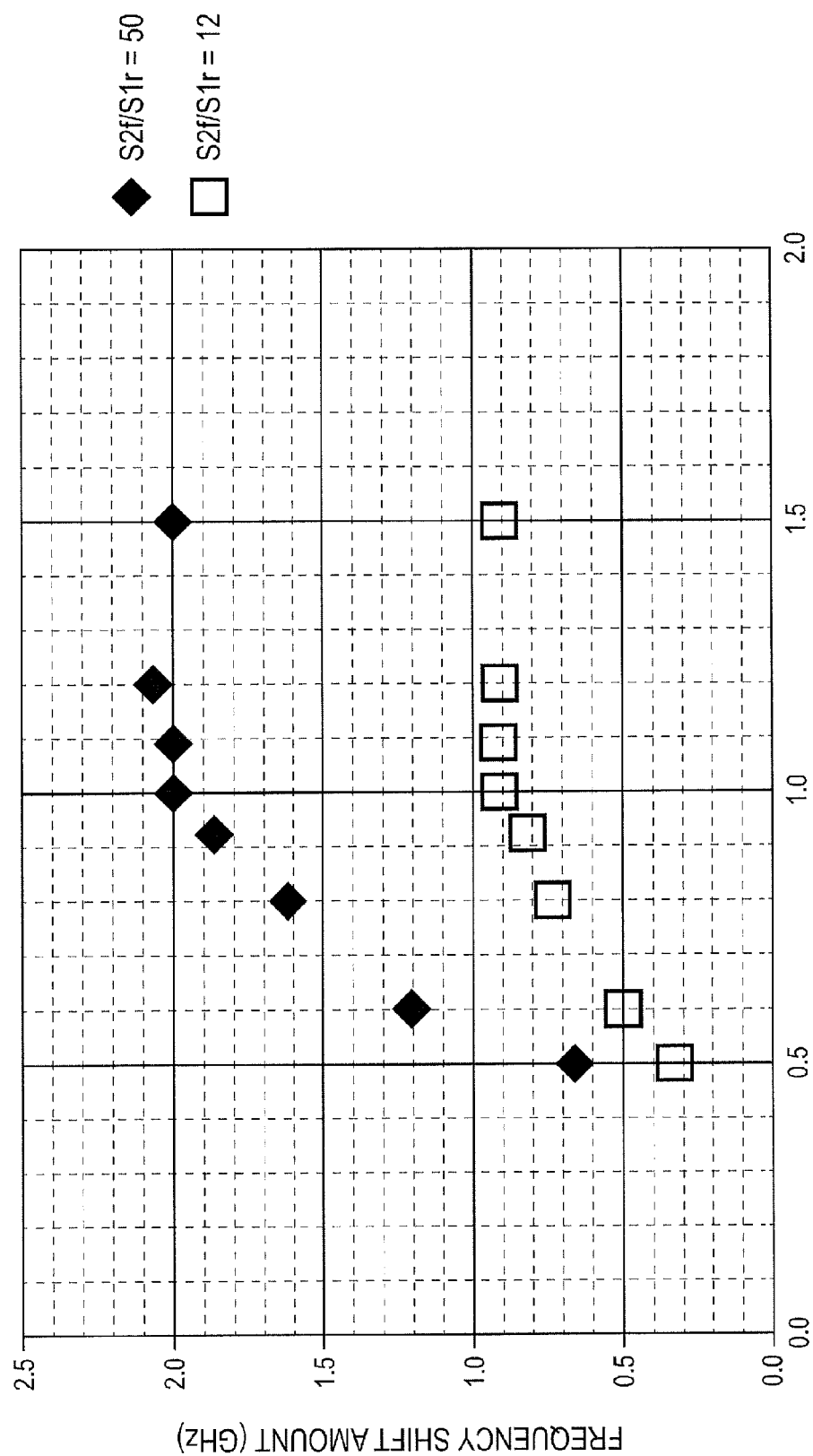
FIG. 11 is a diagram showing a relationship between W1r/W2f and a frequency shift amount when a coil input current is 3 mA.

In the first embodiment, the frequency shift amount was measured when S2f/S1r was 50 and 12, and W1r/W2f was changed. FIG. 11 shows the results.

As shown in FIG. 11, in this embodiment, it was confirmed that the frequency shift amount became maximum by making W1r/W2f larger than 1. This is because by making W1r/W2f larger than 1, the magnetic flux propagation loss when the magnetic flux discharged from the tip end region 61 of the second soft magnetic layer is propagated to the rear end region 42 of the first soft magnetic layer can be suppressed.

Third Embodiment

Figure 12:
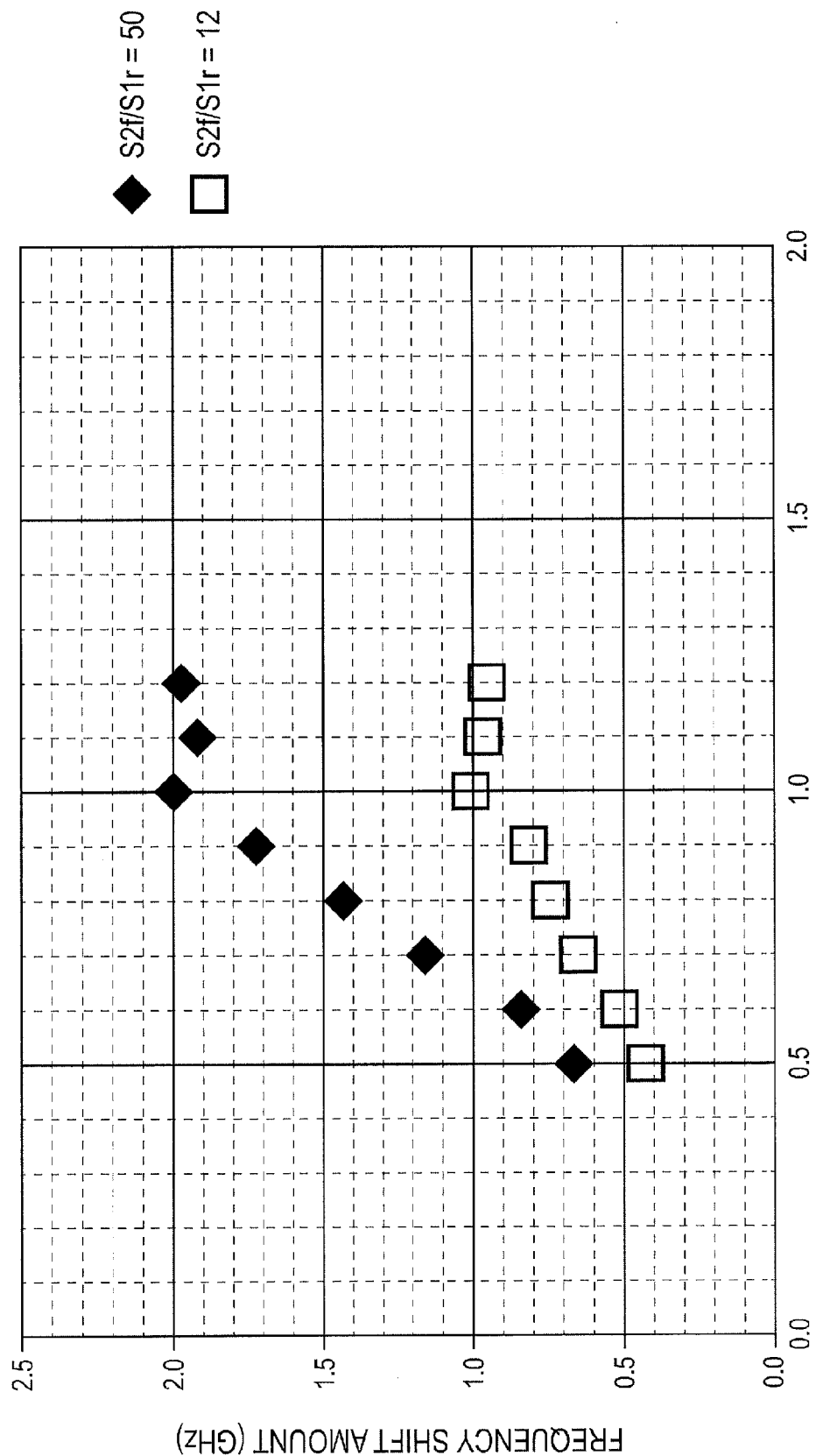
FIG. 12 is a diagram showing a relationship between W1m/W2f and a frequency shift amount when a coil input current is 3 mA.

In the first embodiment, the frequency shift amount was measured when S2f/S1r was 50 and 12, and W1r/W2f was 1.2, and W1m/W2f was changed. FIG. 12 shows the results.

As shown in FIG. 12, in this embodiment, it was confirmed that the frequency shift amount became maximum by making W1m/W2f larger than 1. This will be explained in detail.

Figure 13:
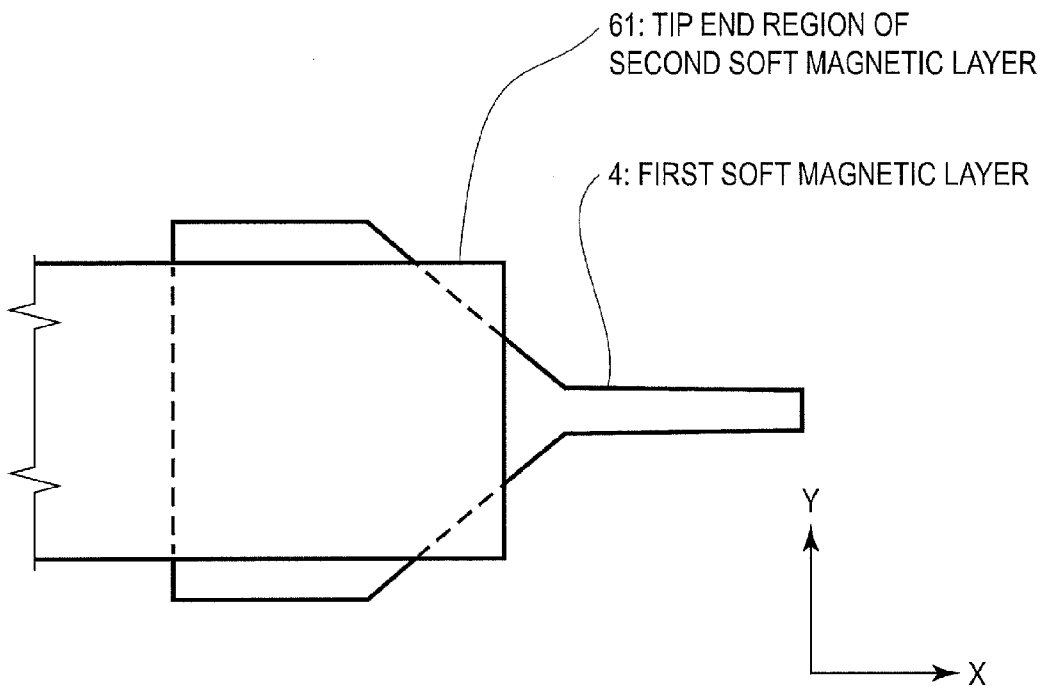
FIG. 13 is a plan view showing a first soft magnetic layer and a second soft magnetic layer tip end region when W1m/W2f is smaller than 1.

FIG. 13 shows a position relationship between the first soft magnetic layer 4 and the tip end region 61 of the second soft magnetic layer when W1m/W2f is smaller than 1. In this case, a magnetic flux propagation loss becomes large when the magnetic flux discharged from the tip end region 61 of the second soft magnetic layer is propagated to the rear end region 42 of the first soft magnetic layer. Because of this, the magnetic field that is applied from the tip end region 41 of the first soft magnetic layer to the magnetoresistive effect film 3 becomes weak, and the frequency shift amount becomes small.

Figure 14:
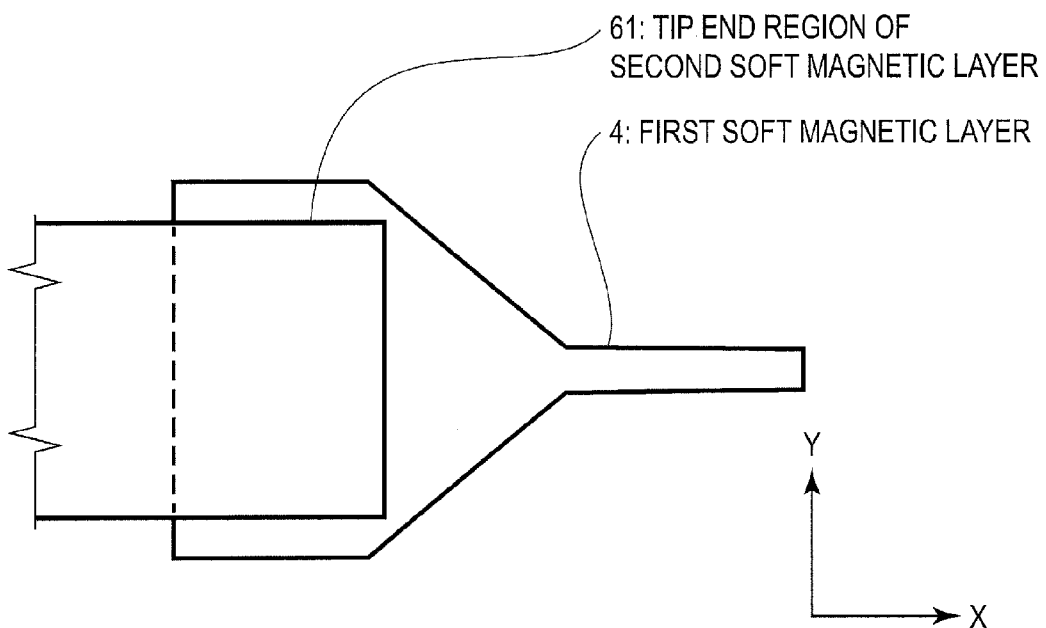
FIG. 14 is a plan view showing the first soft magnetic layer and the second soft magnetic layer tip end region when W1m/W2f is larger than 1.

Meanwhile, FIG. 14 shows a position relationship between the first soft magnetic layer 4 and the tip end region 61 of the second soft magnetic layer when W1m/W2f is larger than 1. In this case, the magnetic flux propagation loss is suppressed when the magnetic flux discharged from the tip end region 61 of the second soft magnetic layer is propagated to the rear end region 42 of the first soft magnetic layer. Thus, compared to the case in which W1m/W2f is smaller than 1, the frequency shift amount can be made large.

Fourth Embodiment

Figure 15:
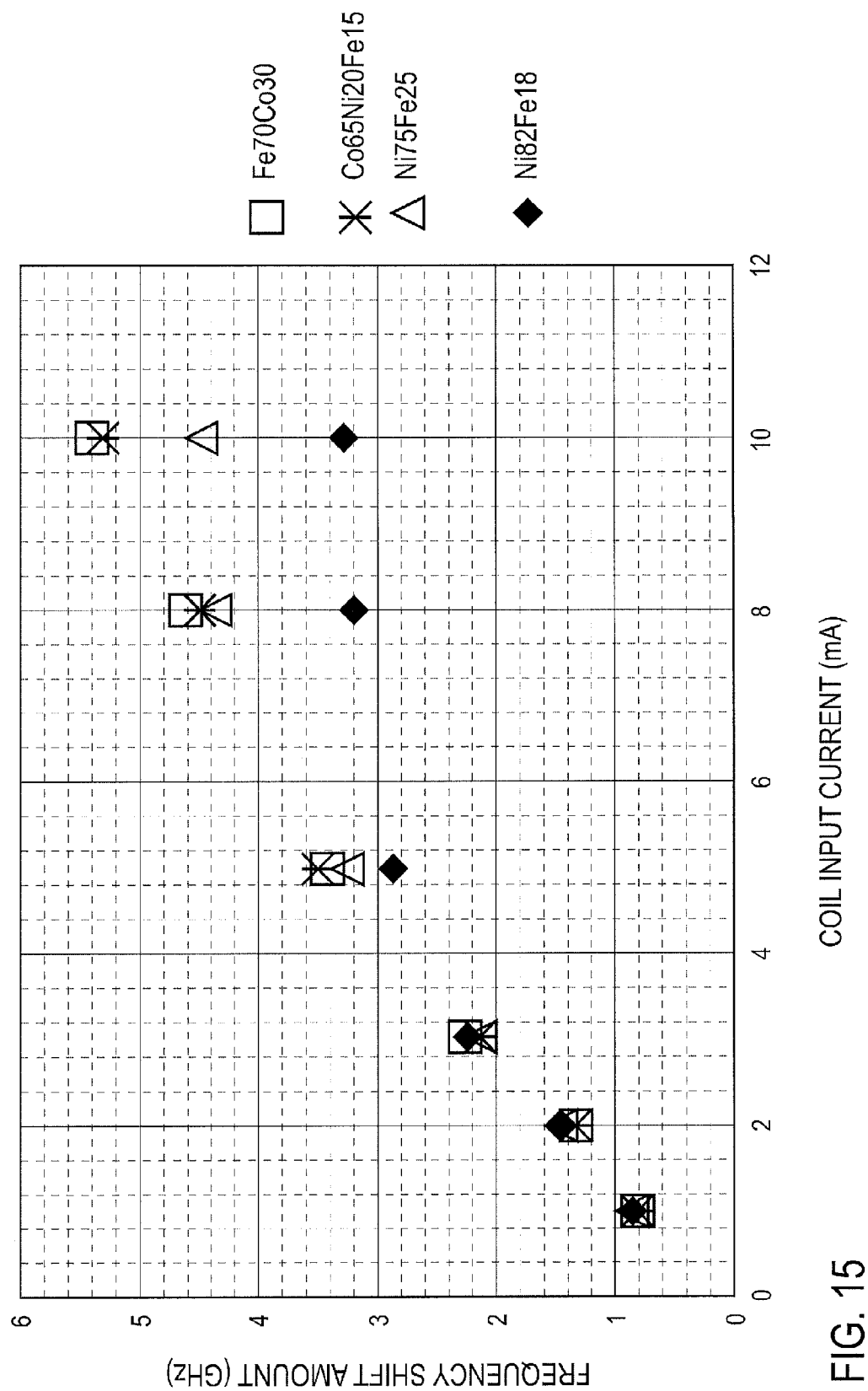
FIG. 15 is a diagram showing a relationship between a coil input current and a frequency shift amount when various materials are applied to the first soft magnetic layer.

FIG. 15 shows a relationship between a frequency shift amount and a coil input current in the first embodiment, (a) when S2f/S1 is 50, and the first soft magnetic layer 4 is made to be Ni82Fe18 with a saturation magnetic flux density 0.9 T, which is the same as the second soft magnetic layer 6, and (b) when the first soft magnetic layer 4 is made to be: (i) Ni75Fe25 with a saturation magnetic flux density 1.2 T, which is higher than that of the second soft magnetic layer 6; (ii) Co65Ni20Fe15 with a saturation magnetic flux density 1.8 T, which is higher than that of the second soft magnetic layer 6; and (iii) Fe70Co30 with a saturation magnetic flux density 2.0 T, which is higher than that of the second soft magnetic layer 6.

As shown in FIG. 15, in this embodiment, when the first soft magnetic layer 4 is Ni82Fe18, the frequency shift amount becomes large in proportion to the coil input current up until the coil input current becomes 5 mA, but when the coil input current becomes 5 mA or larger, the frequency shift amount becomes saturated at approximately 3.3 GHz. Additionally, when the first soft magnetic layer 4 is Ni75Fe25, the frequency shift amount becomes large in proportion to the coil input current up until the coil input current becomes 8 mA, but when the coil input current becomes 8 mA or larger, the frequency shift amount becomes saturated at approximately 4.5 GHz. Meanwhile, in the cases in which the first soft magnetic layer 4 is 65Ni20Fe15 and Fe70Co30, the frequency shift amount becomes large in proportion to the coil input current up until the coil input current becomes 10 mA. These phenomena can be considered as follows.

When the first soft magnetic layer 4 is Ni82Fe18, if the coil input current becomes 5 mA or larger, the magnetic flux density of the tip end region 41 of the first soft magnetic layer reaches saturation, so even if the coil input current is increased so as to increase the magnetic flux, the magnetic flux density of the tip end region 41 of the first soft magnetic layer does not increase. Because of this, the magnetic field generated from the tip end region 41 of the first soft magnetic layer does not change even if the coil input current is increased, and the frequency shift amount does not change, either. In the same manner, when the first soft magnetic layer 4 is Ni75Fe25, if the coil input current becomes 8 mA or larger, the magnetic flux density of the tip end region 41 of the first soft magnetic layer reaches saturation, so even if the coil input current is increased so as to increase the magnetic flux, the magnetic flux density of the tip end region 41 of the first soft magnetic layer does not increase. Because of this, the magnetic field generated from the tip end region 41 of the first soft magnetic layer does not change even if the coil input current is increased and the frequency shift amount does not change, either. Meanwhile, in the cases in which the first soft magnetic layer 4 is Co65Ni20Fe15 and Fe70Co30, at least up until the coil input current becomes 10 mA, the magnetic flux density of the tip end region 41 of the first soft magnetic layer does not reach saturation, so the frequency shift amount becomes large in proportion to the coil input current.

As described above, this invention was specifically explained with reference to the preferred modes, but this invention is not limited to these modes and can be variously modified as long as the invention is within the scope of the claims.

For example, in this embodiment, a bottom type spin valve lamination structure is used, in which the magnetization fixed layer 33 is arranged on the lower electrode layer 2 side, and the magnetization free layer 35 is arranged on the upper electrode layer 5 side. However, a top type spin valve structure is also acceptable in which the magnetization fixed layer 33 is arranged on the upper electrode layer 5 side, and the magnetization free layer 35 is arranged on the lower electrode layer 2 side.

For example, in this embodiment, the second soft magnetic layer 6 is arranged above the first soft magnetic layer 4, in the lamination direction, but can also be arranged below the first soft magnetic layer 4, in the lamination direction.

Additionally, as industrial uses of this invention, local oscillators, radio communication transmitters and receivers, high frequency [magnetic field] assisted magnetic recording elements (MAMR), matching circuits, frequency variable type antenna devices, and the like can be listed.

EXPLANATION OF THE SYMBOLS

1 Substrate
2 Lower electrode layer
3 Magnetoresistive effect film
31 Buffer layer
32 Antiferromagnetic layer
33 Magnetization fixed layer
34 Non-magnetic spacer layer
35 Magnetization free layer
36 Cap layer
4 First soft magnetic layer
41 Tip end region of first soft magnetic layer
42 Rear end region of first soft magnetic layer
5 Upper electrode layer
6 Second soft magnetic layer
61 Tip end region of second soft magnetic layer
62 Tip end portion of second soft magnetic layer
7, 71, 72, 73 Coils
8, 81, 82, 83, 84, 85, 86 Insulating layers

What is claimed is:

1. A thin film magnetic element, comprising:
a magnetoresistive effect film provided with (i) a magnetization fixed layer and (ii) a magnetization free layer via a non-magnetic spacer layer therebetween;
a pair of electrodes arranged via the magnetoresistive effect film in a lamination direction of the magnetoresistive effect film;
a pair of first soft magnetic layers that are separated from the magnetoresistive effect film and are arranged opposite to each other so as to sandwich the magnetoresistive effect film;
a second soft magnetic layer that is more separated from the magnetoresistive effect film than each of the first soft magnetic layers is separated from the magnetoresistive effect film, a part of the second soft magnetic layer being arranged opposite to the pair of first soft magnetic layers in the lamination direction; and
a coil that is windingly formed about the second soft magnetic layer,
wherein when a rear end region cross-sectional area of the first soft magnetic layers is defined as S1r and a tip end region cross-sectional area of the second soft magnetic layer is defined as S2f, a relationship of S2f>S1r is satisfied, and when a tip end width of the first soft magnetic layers is defined as W1f and a rear end width of the first soft magnetic layers is defined as W1r, a relationship of W1r>W1f is satisfied.

2. The thin film magnetic element as set forth in claim 1, wherein when a tip end width of the second soft magnetic layer is W2f, a relationship of W1r>W2f is satisfied.

3. The thin film magnetic element as set forth in claim 1, wherein when an intermediate width of the first soft magnetic layers is defined as W1m, a relationship with a tip end width W2f of the second soft magnetic layer satisfies a relationship of W1m>W2f.

4. The thin film magnetic element as set forth in claim 1, wherein a saturation magnetic flux density of the first soft magnetic layers is larger than that of the second soft magnetic layer.

* * * * *